United States Patent
Han et al.

(10) Patent No.: US 7,884,673 B2
(45) Date of Patent: Feb. 8, 2011

(54) WIDEBAND LOW-NOISE AMPLIFIER

(75) Inventors: Seon Ho Han, Daejeon (KR); Cheon Soo Kim, Daejeon (KR); Jae Young Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/423,764

(22) Filed: Apr. 14, 2009

(65) Prior Publication Data

US 2010/0060363 A1  Mar. 11, 2010

(30) Foreign Application Priority Data

Sep. 5, 2008 (KR) .................. 10-2008-0087904

(51) Int. Cl.
*H03F 3/04* (2006.01)
(52) U.S. Cl. ....................... 330/301; 330/117
(58) Field of Classification Search ............. 330/301, 330/117
See application file for complete search history.

(56) References Cited

U.S. PATENT DOCUMENTS

| | | | | |
|---|---|---|---|---|
| 4,525,678 | A * | 6/1985 | Lehmann et al. | 330/277 |
| 6,121,809 | A * | 9/2000 | Ma et al. | 327/246 |
| 6,806,777 | B2 | 10/2004 | Franca-Neto | |
| 7,224,231 | B2 * | 5/2007 | Wu | 330/301 |
| 2006/0170502 | A1 | 8/2006 | Cha et al. | |
| 2007/0103235 | A1 | 5/2007 | Heck | |
| 2007/0164826 | A1 | 7/2007 | Chang et al. | |
| 2007/0216481 | A1 | 9/2007 | Jimenez et al. | |
| 2007/0216486 | A1 | 9/2007 | Ismail et al. | |

FOREIGN PATENT DOCUMENTS

| KR | 1020070092356 A | 9/2007 |
|---|---|---|
| KR | 1020080014140 A | 2/2008 |

OTHER PUBLICATIONS

Dong-Gu Im et al., "A Wide-Band CMOS Variable-Gain Low Noise Amplifier for Multi-Standard Terrestrial and Cable TV Tuner," IEEE Radio Frequency Integrated Circuits Symposium, Proceedings of 2007 RFIC, Jun. 2007, pp. 621-624.
Chao Fang et al., "A 3.1-10.6 GHz Ultra-Wideband Low Noise Amplifier With 13dB Gain, 3.4-dB Noise Figure, and Consumes Only 12.9mW of DC Power," IEEE Microwave and Wireless Components Letters, Apr. 2007, pp. 295-297, vol. 17, No. 4.
Ke-Hou Chen et al., "An Ultra-Wide-Band 0.4-10-GHz LNA in 0.18 μm CMOS," IEEE Transactions on Circuits and Systems—II: Express Beliefs, Mar. 2007, pp. 217-221, vol. 54, No. 3.
Yuanjin Zheng et al., "A CMOS Carrier-less UWB Transceiver for WPAN Applications," IEEE International Solid-State Circuits Conference, Proceedings of ISSCC 2006, Feb. 2006, pp. 378-387.

* cited by examiner

*Primary Examiner*—Henry K Choe

(57) ABSTRACT

A wideband low-noise amplifier includes a source-degenerated common-source amplifier, a common-gate amplifier, and a matching frequency band determiner. The source-degenerated common-source amplifier is configured to amplify an input signal to output a first signal that is opposite in phase to the input signal. The common-gate amplifier is connected in parallel to the source-degenerated common-source amplifier to amplify the input signal to output a second signal that has the same phase as the input signal. The matching frequency band determiner is configured to isolate an input terminal of the source-degenerated common-source amplifier and an input terminal of the common-gate amplifier and determine a matching frequency band.

8 Claims, 5 Drawing Sheets

WIDEBAND LOW-NOISE AMPLIFIER

CROSS-REFERENCE TO RELATED APPLICATIONS

This application claims the priority of Korean Patent Application No. 10-2008-0087904 filed on Sep. 5, 2008, in the Korean Intellectual Property Office, the disclosure of which is incorporated herein by reference.

BACKGROUND OF THE INVENTION

1. Field of the Invention

The present invention related to a wideband low-noise amplifier, and more particularly, to a wideband low-noise amplifier that can provide stable wideband matching characteristics, high power gain characteristics, and low noise figure characteristics simultaneously.

2. Description of the Related Art

Wideband amplifiers capable of low-noise amplifying wideband signals have become necessary due to an increase in the wireless communication data rate.

Such a wideband amplifier has a wider signal band than a conventional narrowband amplifier. Thus, the wideband amplifier has a lower power gain and a higher noise figure than the conventional narrowband amplifier. Therefore, the wideband amplifier requires a trade-off between a wideband matching property, a power gain and a noise figure in the circuit design process.

However, a conventional wideband amplifier provides just a slight improvement in performance, failing to provide a considerable improvement in performance.

In the case of integrated circuits for processing Radio Frequency (RF) signals, selection of a differential structure is advantageous in terms of reducing a noise influence. Also, in the case of a direct-conversion transmitter, selection of a differential structure is advantageous in consideration of the performance degradation due to a Local Oscillation (LO) leakage.

A balun for Single-ended To Differential must be additionally provided to design a differential structure. In such a case, additional power consumption occurs due to the balun. Also, if the frequency is high, good single-ended to differential characteristics are difficult to obtain and the design is complicated.

SUMMARY OF THE INVENTION

An aspect of the present invention provides a wideband low-noise amplifier that can provide wideband impedance matching characteristics, low noise figure characteristics, and high power gain characteristics simultaneously.

Another aspect of the present invention provides a wideband low-noise amplifier that can convert a single signal into differential signals by itself even without the use of a separate circuit such as a balun.

According to an aspect of the present invention, there is provided a wideband low-noise amplifier including: a source-degenerated common-source amplifier amplifying an input signal to output a first signal that is opposite in phase to the input signal; a common-gate amplifier connected in parallel to the source-degenerated common-source amplifier to amplify the input signal to output a second signal that has the same phase as the input signal; and a matching frequency band determiner isolating an input terminal of the source-degenerated common-source amplifier and an input terminal of the common-gate amplifier and determine a matching frequency band.

The matching frequency band determiner may include at least one of: a first impedance disposed at the input terminal of the source-degenerated common-source amplifier to determine a matching frequency band of the source-degenerated common-source amplifier; and a second impedance disposed at the input terminal of the common-gate amplifier to determine a matching frequency band of the common-gate amplifier. Each of the first impedance and the second impedance may include an inductor or an inductor and a capacitor that are connected in series to each other.

The source-degenerated common-source amplifier and the common-gate amplifier may have different matching frequency bands.

The source-degenerated common-source amplifier may include: an inductor connected to a ground voltage; a first transistor having a gate connected to the first impedance and a source connected to the inductor, and amplifying an input signal, which is applied through the first impedance to the gate thereof, to output the resulting signal through a drain thereof; and a resistor applying a bias voltage to the gate of the first transistor.

The common-gate amplifier may include: a third impedance connected to a ground voltage; a second transistor having a source connected commonly to the second impedance and the third impedance and a gate to which a bias voltage is applied, and amplifying an input signal, which is applied through the second impedance to the source thereof, to output the resulting signal through a drain thereof; and a resistor applying the bias voltage to the gate of the second transistor. The third impedance may include an inductor.

The wideband low-noise amplifier may further include: a current buffer including a third transistor and a fourth transistor respectively connected in cascade to the source-degenerated common-source amplifier and the common-gate amplifier to increase a reverse isolation; and an output load extending the frequency bandwidth of the first signal and the frequency bandwidth of the second signal and to even a power gain.

The output load may include a shunt-peaking network or a tuning switch network.

According to another aspect of the present invention, there is provided a wideband low-noise amplifier including: an input unit generating two differential signals by using an input signal, the input unit including a source-degenerated common-source amplifier; a common-gate amplifier connected in parallel to the source-degenerated common-source amplifier; and a matching frequency band determiner isolating an input terminal of the source-degenerated common-source amplifier and an input terminal of the common-gate amplifier and determine a matching frequency band; a current buffer increasing a reverse isolation, the current buffer including transistors that are respectively connected in cascade to the source-degenerated common-source amplifier and the common-gate amplifier; and an output load extending the frequency bandwidth of the first signal and the frequency bandwidth of the second signal and to even a power gain.

The matching frequency band determiner may include at least one of: a first impedance disposed at the input terminal of the source-degenerated common-source amplifier to determine a matching frequency band of the source-degenerated common-source amplifier; and a second impedance disposed at the input terminal of the common-gate amplifier to determine a matching frequency band of the common-gate amplifier.

The source-degenerated common-source amplifier and the common-gate amplifier may have different matching frequency bands.

The source-degenerated common-source amplifier may include: an inductor connected to a ground voltage; a first transistor having a gate connected to the first impedance and a source connected to the inductor, and amplifying an input signal, which is applied through the first impedance to the gate thereof, to output the resulting signal through a drain thereof; and a resistor applying a bias voltage to the gate of the first transistor.

The common-gate amplifier may include: a third impedance connected to a ground voltage; a second transistor having a source connected commonly to the second impedance and the third impedance and a gate to which a bias voltage is applied, and amplifying an input signal, which is applied through the second impedance to the source thereof, to output the resulting signal through a drain thereof; and a resistor applying the bias voltage to the gate of the second transistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
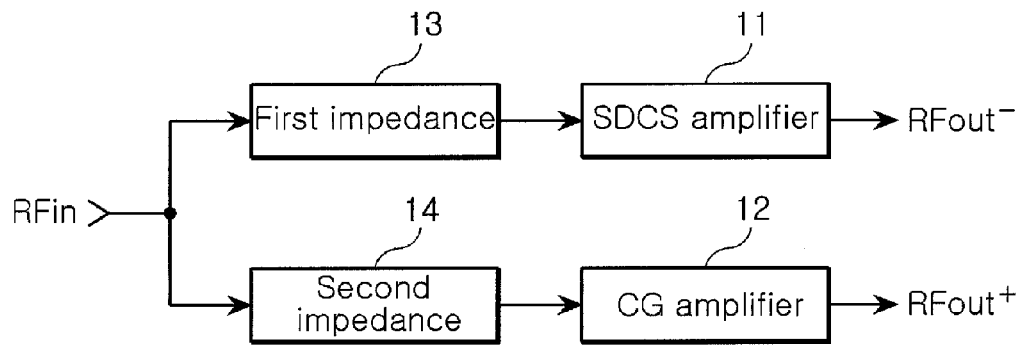
FIG. 1 is a diagram illustrating an input unit of a wideband low-noise amplifier according to an embodiment of the present invention.

Exemplary embodiments of the present invention will now be described in detail with reference to the accompanying drawings. In the following description of the embodiments of the present invention, detailed descriptions of well-known functions or configurations will be omitted if they are deemed to obscure the subject matter of the present invention in unnecessary detail.

In the accompanying drawings, portions irrelevant to the description of the present invention will be omitted for clarity. Like reference numerals refer to like elements throughout.

Also, it will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless otherwise specified.

FIG. 1 is a diagram illustrating an input unit of a wideband low-noise amplifier according to an embodiment of the present invention.

Referring to FIG. 1, an input unit of a wideband low-noise amplifier according to an embodiment of the present invention includes a Source-Degenerated Common-Source (SDCS) amplifier 11, a Common-Gate (CG) amplifier 12, a first impedance 13, and a second impedance 14. The SDCS amplifier 11 and the CG amplifier 12 are connected in parallel to each other. The first impedance 13 is connected to the front end of the SDCS amplifier 11, and the second impedance 14 is connected to the front end of the CG amplifier 12.

The SDCS amplifier 11 has high power gain characteristics and low noise figure characteristics. The SDCS amplifier 11 amplifies an input signal RFin applied to an input terminal and outputs a first signal RFout− that is opposite in phase to the input signal RFin.

The CG amplifier 12 has good wideband matching characteristics, relatively low power gain characteristics, and high noise characteristics. The CG amplifier 12 amplifies the input signal RFin applied to the input terminal and outputs a second signal RFout+ that has the same phase as the input signal RFin.

The first impedance 13 and the second impedance 14 isolate the SDCS amplifier 11 and the CG amplifier 12, and also determine the matching frequency band of the SDCS amplifier 11 and the matching frequency band of the CG amplifier 12.

It is preferable that the SDCS amplifier 11 and the CG amplifier 12 have different matching frequency bands through the first impedance 13 and the second impedance 14. In this case, the matching frequency band of the SDCS amplifier 11 and the matching frequency band of the CG amplifier 12 are continuous with each other from the viewpoint of the common input of the wideband low-noise amplifier and thus the matching frequency band is extended, so that the wideband low-noise amplifier can have wideband matching characteristics.

To this end, the SDCS amplifier 11 and the CG amplifier 12 are connected in parallel to each other; the input terminal of the SDCS amplifier 11 and the input terminal of the CG amplifier 12 are isolated by the first impedance 13 and the second impedance 14; and the SDCS amplifier 11 and the CG amplifier 12 are configured to have different matching frequency bands, as illustrated in FIG. 1. In this case, the matching frequency band of the SDCS amplifier 11 and the matching frequency band of the CG amplifier 12 are continuous with each other, so that the wideband low-noise amplifier has wideband matching characteristics.

Also, the high power gain characteristics and the low noise figure characteristics of the SDCS amplifier 11 improve the power gain characteristics and the noise characteristics in the matching frequency band of the CG amplifier 12, so that the wideband low-noise amplifier has high power gain characteristics and low noise figure characteristics.

Thus, the wideband low-noise amplifier of the present invention can provide stable wideband matching characteristics, high power gain characteristics, and low noise figure characteristics.

Also, the wideband low-noise amplifier of the present invention receives one input signal RFin through the SDCS amplifier 11 and the CG amplifier 12 to generate two signals RFout+ and RFout− that have differential phases. That is, the wideband low-noise amplifier converts a single signal into two differential signals by itself even without the use of a separate circuit such as a balun.

Figure 2:
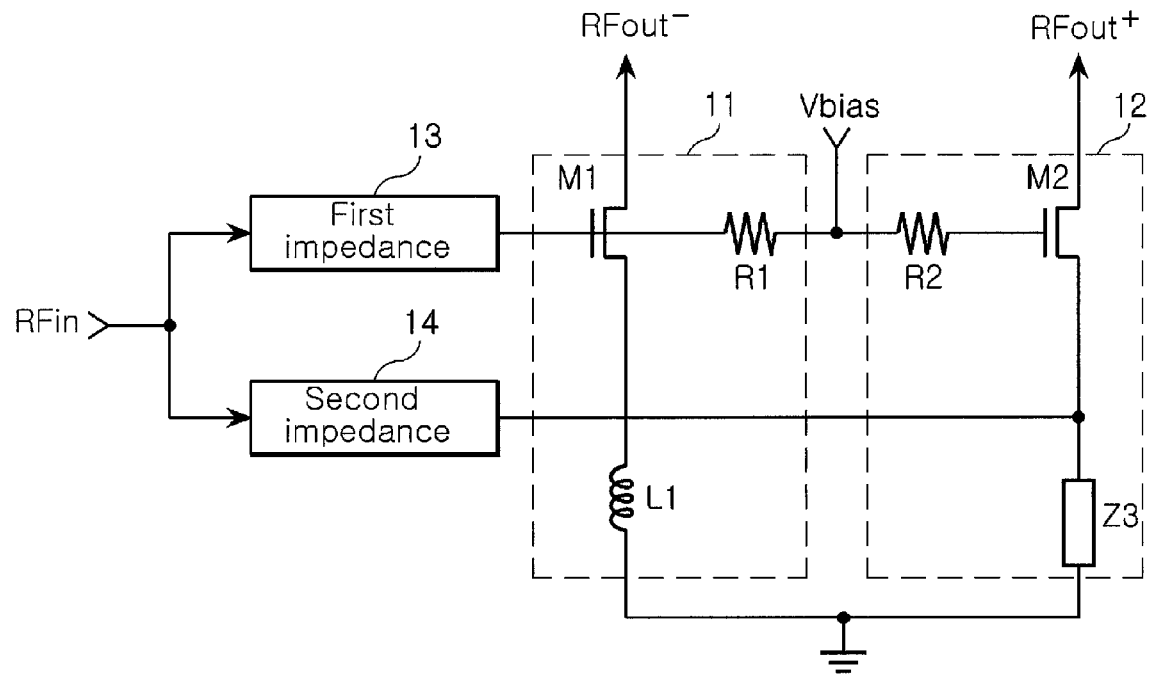
FIG. 2 is a diagram illustrating the configuration of the input unit of the wideband low-noise amplifier of FIG. 1.

FIG. 2 is a diagram illustrating the configuration of the input unit of the wideband low-noise amplifier of FIG. 1.

Referring to FIG. 2, the SDCS amplifier 11 includes a first inductor L1, a first transistor M1, and a first resistor R1. The first inductor L1 is connected to a ground voltage. The first transistor M1 has a gate connected to the first impedance 13 and a source connected to the first inductor L1. The first transistor M1 amplifies an input signal RFin, which is applied through the first impedance 13 to its gate, and outputs the resulting signal through its drain. The first resistor R1 is configured to apply a bias voltage Vbias to the gate of the first transistor M1.

The CG amplifier 12 includes a third impedance Z3, a second transistor M2, and a second resistor R2. The third impedance Z3 is connected to the ground voltage. The second transistor M2 has a gate to which a bias voltage Vbias is applied and a source connected commonly to the second impedance 14 and the third impedance Z3. The second transistor M2 amplifies an input signal RFin, which is applied through the second impedance 14 to its source, and outputs the resulting signal through its drain. The second resistor R2 is configured to apply the bias voltage Vbias to the gate of the second transistor M2.

As in the conventional narrowband low-noise amplifier, the SDCS amplifier 11 has an input impedance expressed as Equation (1) below.

$$Z_{SDCS} = \frac{g_{m(M1)} L1}{C_{GS}} \qquad (1)$$

where $g_{m(M1)}$ denotes the transconductance of the first transistor M1, L1 denotes the first inductor disposed between the ground voltage and the source of the first transistor M1, and $C_{GS}$ denotes a parasitic capacitor (not illustrated) disposed between the source and the gate of the first transistor M1.

An input impedance value of the SDCS amplifier 11, expressed as Equation (1), is set to be equal to an output impedance value (e.g., about 50Ω) of a signal input unit (not illustrated) connected to the input terminal, thereby performing an input impedance matching operation.

The first inductor L1 and the parasitic capacitor CGS of the first transistor M1 perform a resonating operation on the input signal RFin to increase the signal size of the input signal RFin applied to the gate of the first transistor M1.

The transistor M1, i.e., the SDCS amplifier 11 receives a signal with an increased signal size to perform an amplifying operation, thus providing the high power gain characteristics and the low noise figure characteristics as described above.

The CG amplifier 12 has an input impedance expressed as Equation (2) below.

$$Z_{CG} = \frac{1}{g_{m(M2)}} \qquad (2)$$

where $g_{m(M2)}$ denotes the transconductance of the second transistor M2.

An input impedance value of the CG amplifier 12, expressed as Equation (2), is set to be equal to the output impedance value of the signal input unit connected to the input terminal, thereby performing an input impedance matching operation.

In this way, the CG amplifier 12 can perform an impedance matching operation by controlling the transconductance $g_{m(M2)}$ of the second transistor M2, which is suitable for a wideband matching operation.

However, the transconductance $g_{m(M2)}$ of the second transistor M2 is limited to a specific value by the output impedance value of the signal input unit to limit the power gain and the noise figure, which is disadvantageous in obtaining the high power gain characteristics and the low noise figure characteristics.

Thus, according to the present invention, the SDCS amplifier 11 and the CG amplifier 12 are connected in parallel to each other and thus the power gain characteristics and the noise characteristics of the CG amplifier 12 are complemented by the high power gain characteristics and the low noise figure characteristics of the SDCS amplifier 11, so that the wideband low-noise amplifier can have the high power gain characteristics and the low noise figure characteristics.

Figure 3:
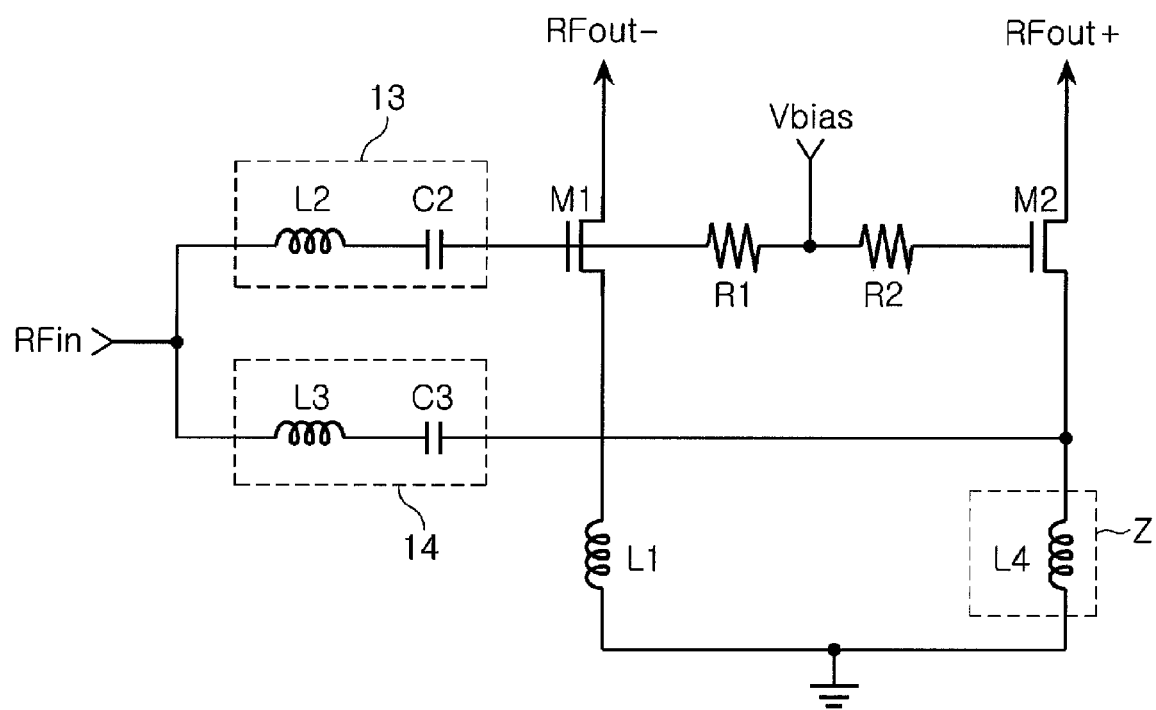
FIG. 3 is a detailed circuit diagram of the input unit of the wideband low-noise amplifier of FIG. 2.

FIG. 3 is a detailed circuit diagram of the input unit of the wideband low-noise amplifier of FIG. 2.

Referring to FIG. 3, the first impedance 13 includes an inductor L2 determining a matching frequency band and a capacitor C2 interrupting a direct voltage and a direct current. The second impedance 14 includes an inductor L3 determining a matching frequency band and a capacitor C3 interrupting a direct voltage and a direct current. The third impedance Z3 includes an inductor 14.

The above configuration may vary adaptively according to users' needs and the operational characteristics of the amplifier. For example, it will be apparent to those skilled in the art that the first impedance 13 or the second impedance 14 may include only an inductor.

Although it has been described in the above embodiment that both of the first impedance 13 and the second impedance 14 are provided to isolate the SDCS amplifier 11 and the CG amplifier 12 and set the matching frequency band, it will be apparent to those skilled in the art that only one of the first impedance 13 and the second impedance 14 is provided to perform the above function.

Figure 4:
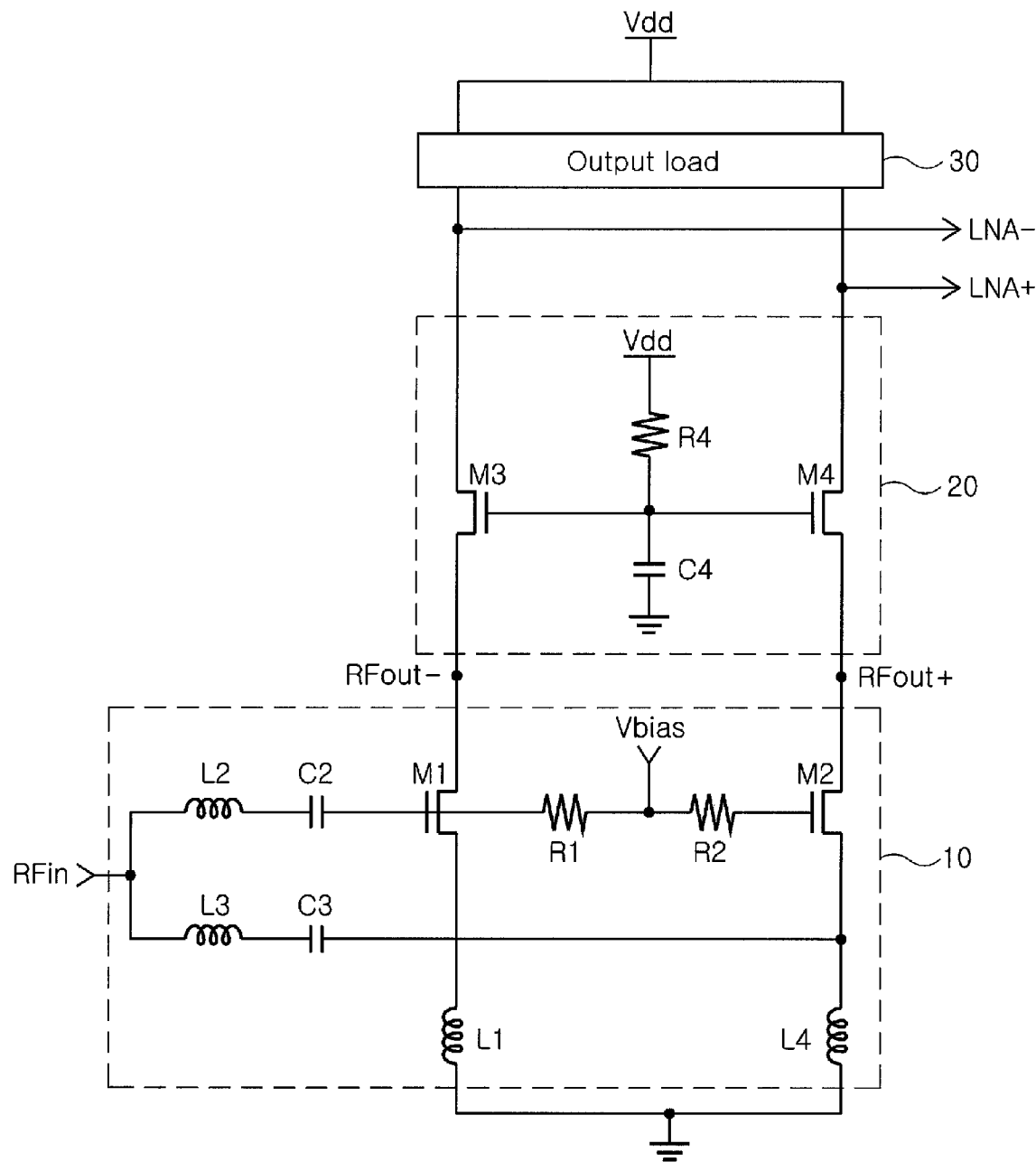
FIG. 4 is a diagram illustrating a wideband low-noise amplifier according to another embodiment of the present invention.

FIG. 4 is a diagram illustrating a wideband low-noise amplifier according to another embodiment of the present invention.

Referring to FIG. 4, a wideband low-noise amplifier according to another embodiment of the present invention includes a current buffer 20 and an output load 30, in addition to an input unit 10 that is configured and operated as illustrated in FIGS. 1 to 3.

The current buffer 20 includes a third transistor M3, a fourth transistor M4, a fourth resistor R4, and a fourth capacitor C4. The third transistor M3 and the fourth transistor M4 are respectively connected in cascade to the first transistor M1 and the second transistor M2, and the fourth transistor R4 and the fourth capacitor C4 are connected to apply an operation voltage Vdd to the gate of the third transistor M3 and the gate of the fourth transistor M4, thereby increasing the reverse isolation between the input and the output.

That is, the current buffer 20 prevents, to the utmost, a Local Oscillation (LO) signal from being input from the rear end of the wideband low-noise amplifier, and minimizes the feedback from the output to the input, thereby enhancing the circuit stability.

The output load 30 is configured to include a shunt-peaking network or a tuning switch network, so that two output signals LNA+ and LNA− output through the current buffer 20 have flat amplification characteristics throughout a wide frequency band. That is, the output load 30 extends the frequency bandwidth of the output signals LNA+ and LNA− and evens the power gain.

Figure 5:
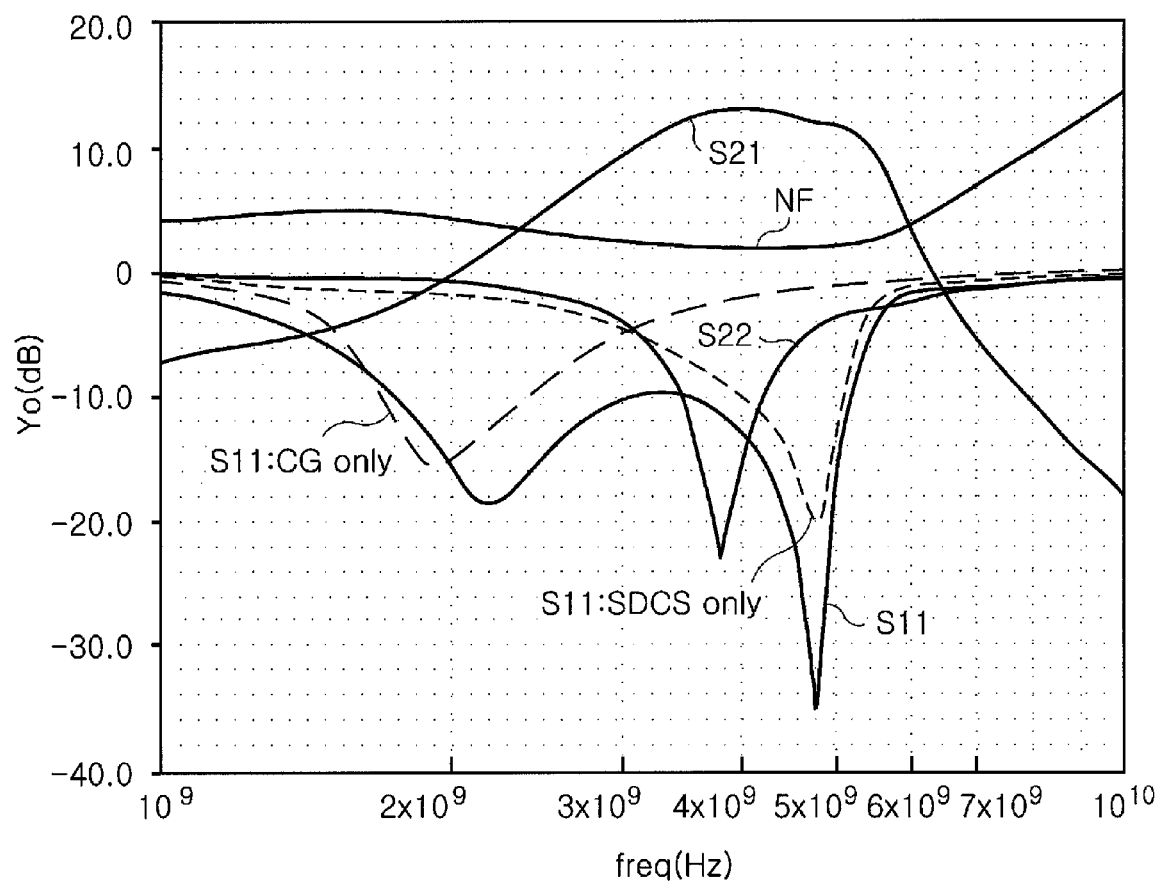
FIGS. 5 and 6 are diagrams illustrating the operational characteristics of the wideband low-noise amplifier according to an embodiment of the present invention.

FIG. 5 is a diagram illustrating the operational characteristics of the wideband low-noise amplifier according to an embodiment of the present invention.

When the CG amplifier 12 and the SDCS amplifier 11, which have different matching frequency bands, are connected in parallel to each other as described above, the different matching frequency bands are continuous with each other as illustrated in FIG. 5.

That is, it can be seen that a matching frequency band S11 of the wideband low-noise amplifier (i.e., a frequency band with an input reflection coefficient of about −10 dB or less) is extended.

Also, it can be seen that a forward transmission coefficient S21 of the wideband low-noise amplifier increases up to about 13.5 dB due to the high power gain characteristics and the low noise figure characteristics of the SDCS amplifier 11 whereas the noise figure (NF) decreases down to about 2 dB.

As described above, the wideband low-noise amplifier of the present invention performs a signal amplifying operation in a wider frequency band, thus making it possible to provide a high power gain and a lower noise figure value.

The operational characteristics of the wideband low-noise amplifier described with reference to FIG. 5 are merely illustrative, which may vary according to the operational environments and the operational characteristics of a product to which the wideband low-noise amplifier of the present invention is applied.

That is, the operational characteristics of the wideband low-noise amplifier can be varied adaptively by changing the matching frequency bands, the power gains and the noise figures of the CG amplifier 12 and the SDCS amplifier 11.

Figure 6:
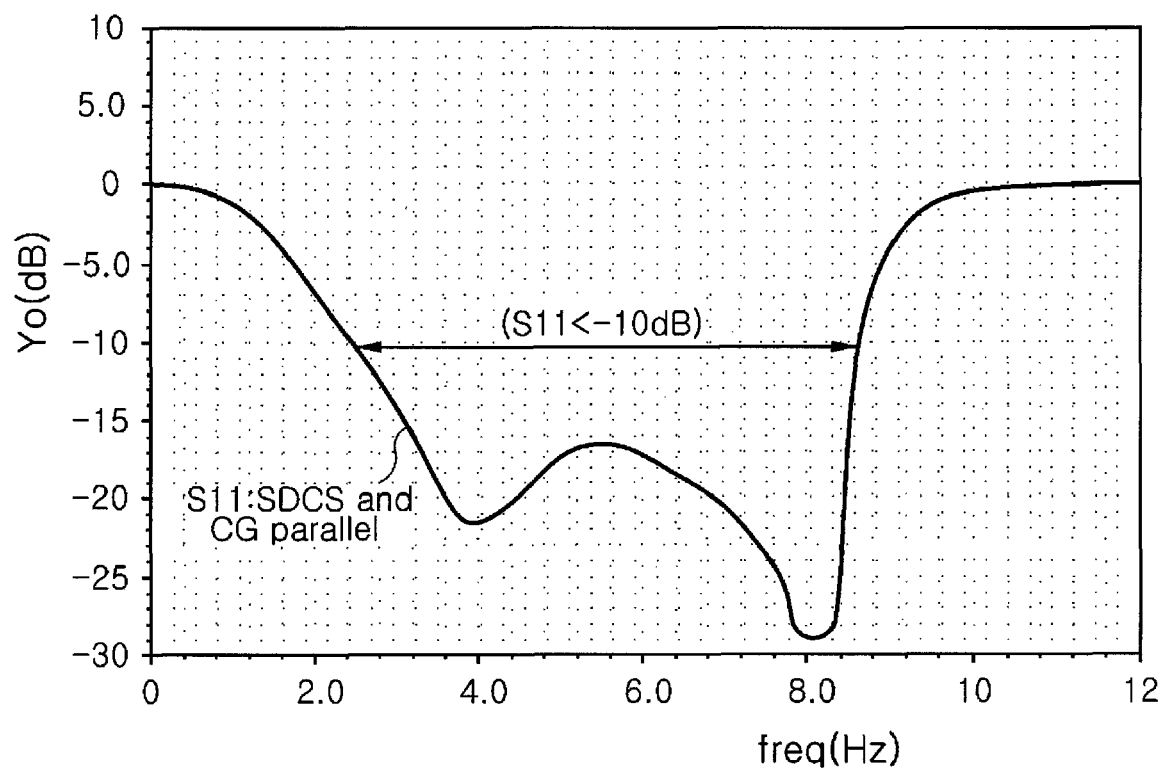

For example, as illustrated in FIG. 6, the matching frequency band of the wideband low-noise amplifier can be further extended by changing the matching frequency bands of the CG amplifier 12 and the SDCS amplifier 11. Also, the power gain and the noise figure of the wideband low-noise amplifier can be varied adaptively according to the same principle.

While the present invention has been shown and described in connection with the exemplary embodiments, it will be apparent to those skilled in the art that modifications and variations can be made without departing from the spirit and scope of the invention as defined by the appended claims.

As described above, according to the wideband low-noise amplifier of the present invention, the SDCS amplifier and the CG amplifier are connected in parallel to each other, the input terminal of the SDCS amplifier and the input terminal of the CG amplifier are isolated by at least one impedance, and the SDCS amplifier and the CG amplifier are configured to have different matching frequency bands, thereby making it possible to provide stable wideband matching characteristics, high power gain characteristics, and low noise figure characteristics simultaneously.

Also, the wideband low-noise amplifier of the present invention converts a single signal into differential signals by itself even without the use of a separate circuit such as a balun, thereby making it possible to provide good single-ended to differential characteristics and also simplify the design.

What is claimed is:

1. A wideband low-noise amplifier comprising:
a source-degenerated common-source amplifier configured to amplify an input signal to output a first signal that is opposite in phase to the input signal;
a common-gate amplifier connected in parallel to the source-degenerated common-source amplifier and configured to amplify the input signal to output a second signal that has the same phase as the input signal; and
a matching frequency band determiner configured to isolate an input terminal of the source-degenerated common-source amplifier from an input terminal of the common-gate amplifier and to determine matching frequency bands of the source-degenerated common-source amplifier and the common-gate amplifier, wherein the matching frequency bands are different from and substantially continuous with each other.

2. The wideband low-noise amplifier of claim 1, wherein the matching frequency band determiner comprises at least one of:
a first impedance disposed at the input terminal of the source-degenerated common-source amplifier to determine the matching frequency band of the source-degenerated common-source amplifier; and
a second impedance disposed at the input terminal of the common-gate amplifier to determine the matching frequency band of the common-gate amplifier.

3. The wideband low-noise amplifier of claim 2, wherein each of the first impedance and the second impedance comprises an inductor or an inductor and a capacitor that are connected in series to each other.

4. The wideband low-noise amplifier of claim 2, wherein the source-degenerated common-source amplifier comprises:
an inductor connected to a ground voltage;
a first transistor having a gate connected to the first impedance and a source connected to the inductor, and amplifying an input signal, which is applied through the first impedance to the gate thereof, to output the resulting signal through a drain thereof; and
a resistor applying a bias voltage to the gate of the first transistor.

5. The wideband low-noise amplifier of claim 2, wherein the common-gate amplifier comprises:
a third impedance connected to a ground voltage;
a second transistor having a source connected commonly to the second impedance and the third impedance and a gate to which a bias voltage is applied, and amplifying an input signal, which is applied through the second impedance to the source thereof, to output the resulting signal through a drain thereof, and a resistor applying the bias voltage to the gate of the second transistor.

6. The wide band low-noise amplifier of claim 5, wherein the third impedance comprises an inductor.

7. The wideband low-noise amplifier of claim 1, further comprising:
a current buffer comprising a third transistor and a fourth transistor respectively connected in cascade to the source-degenerated common-source amplifier and the common-gate amplifier to increase a reverse isolation; and
an output load configured to extend the frequency bandwidth of the first signal and the frequency bandwidth of the second signal and to even a power gain.

8. The wideband low-noise amplifier of claim 7, wherein the output load comprises a shunt-peaking network or a tuning switch network.

* * * * *